United States Patent [19]
Ruggiero

[11] 3,762,038
[45] Oct. 2, 1973

[54] THERMAL DISPLAYS USING AIR ISOLATED INTEGRATED CIRCUITS AND METHODS OF MAKING SAME

[75] Inventor: Edward M. Ruggiero, Dallas, Tex.

[73] Assignee: Texas Instruments Incorporated, Dallas, Tex.

[22] Filed: Sept. 9, 1970

[21] Appl. No.: 70,742

Related U.S. Application Data

[62] Division of Ser. No. 650,821, July 3, 1967.

[52] U.S. Cl. .......... 29/577, 29/578, 29/590
[51] Int. Cl. .......... B01j 17/00
[58] Field of Search .......... 29/577, 578, 588, 29/589, 590, 591

[56] References Cited

UNITED STATES PATENTS

| | | | |
|---|---|---|---|
| 3,542,550 | 11/1970 | Conrad et al. | 29/588 |
| 3,508,325 | 4/1970 | Perry | 29/578 |

*Primary Examiner*—Charles W. Lanham
*Assistant Examiner*—W. Tupman
*Attorney*—Samuel M. Mims, Jr. et al.

[57] ABSTRACT

Thermal display including an air-isolated integrated semiconductor circuit having a semiconductor heating element array joined by a metallic connecting pattern which expands out over the heating elements to interconnect selected ones of them and form bonding pads. The thermally sensitive material on which a dynamic display is formed or on which a permanent display is printed is in direct contact with the monocrystalline semiconductor material of the heating element array. Circuit elements are formed within the monocrystalline semiconductor material of the heating element array and are mounted face down on a support having openings therein so that the metallic connecting pattern extends between the heating element array and the support to bonding pads which are exposed within the openings. Connections are made to the bonding pads through the openings to a metallized pattern on the underside of the support so that the connections are sufficiently displaced from the thermally sensitive display material. A parting agent is selectively located over the bonding pads prior to the mounting of the heating element array on the support to prevent the adhesive from covering the bonding pads and allow the connections to be made after the mounting of the heating element array on the support. The openings in the support also allow infrared alignment techniques to be utilized with an opaque support for air isolating the heater elements of the array and provide improved thermal as well as electrical isolation between the heater elements.

8 Claims, 6 Drawing Figures

INVENTOR

BY

ATTORNEY

THERMAL DISPLAYS USING AIR ISOLATED INTEGRATED CIRCUITS AND METHODS OF MAKING SAME

This application is a division of copending application Ser. No. 650,821, filed July 3, 1967, now abandoned.

The present invention relates to thermal displays of the type having an array of heater elements selectively energized to provide an information display on thermally sensitive material, to air isolated integrated semiconductor circuits useful as the heater element array and to methods of making such integrated semiconductor circuits.

An object of the present invention is to provide an improved and simplier thermal display.

Another object of the present invention is to provide an improved method of fabricating an air-isolated semiconductor circuit useful as a heating element array for a thermal display.

Other objects, features, and advantages of the invention may be best understood by reference to the following detailed description taken in conjunction with the accompanying drawings in which like reference numerals indicate like parts and in which.

Figures 1, 2:
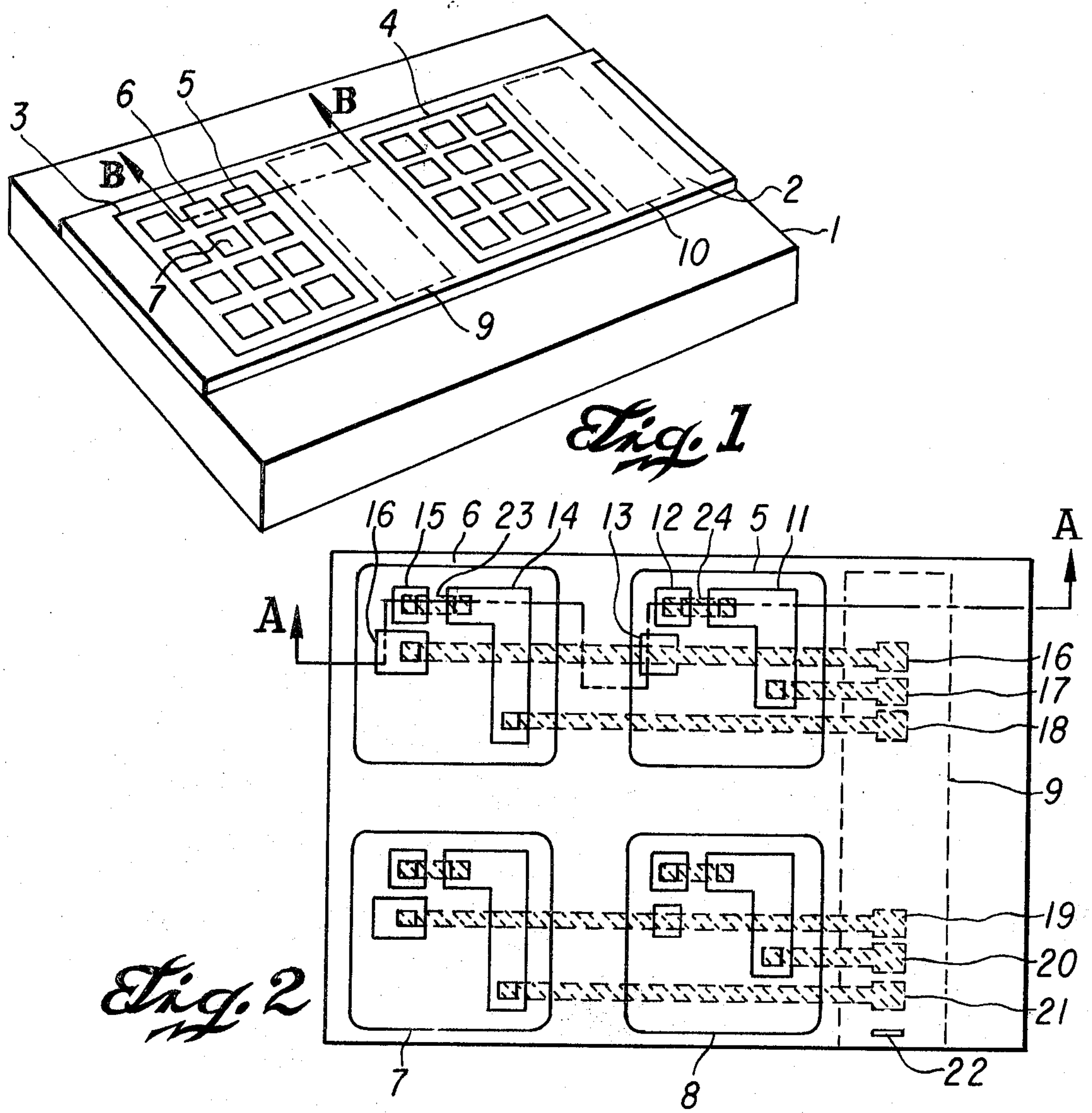
FIG. 1 is a top view of a heating element array according to the present invention.
FIG. 2 is a partial view of the underside of the semiconductor wafer 2 of FIG. 1.

FIG. 1 illustrates a series of 4 by 3 heater element arrays 3, 4 etc. over which thermally sensitive material is positioned to form a dynamic information display of the type described in U.S. Pat. No. 3,323,341 by J. W. Blair et al. in which the described thermochromic materials are used or over which is passed a specially treated thermally sensitive material to form a permanent information display or printer of the type described in U.S. Pat. No. 3,496,333 which is a continuation of application 492,174, now abandoned, by Emmons et al., filed Oct. 1, 1965 and assigned to the assignee of the present application.

A monocrystalline silicon semiconductor wafer 2 is mounted on the insulating support 1 which may be any suitable material for example, ceramic, glass or sapphire, by way of an insulating adhesive having good thermal and electrical insulating properties. The insulating adhesive may be epoxy since it has excellent adhesion qualities to silicon and ceramic for example, is easily applied as a liquid and cured to a rigid solid, is solvent free and can be cured to provide a bubble-free film, is rigid and yet has some resiliency so as not to crack under physical or thermal stress, is a good electrical and thermal insulator and can withstand fabrication temperatures up to 200° C.

Each heater element of the array comprises a monocrystalline semiconductor body in a mesa shape and contains a heater element formed therein at the underside of the mesa adjacent on the support 1 so that when the heater element is energized, a "hot spot" is formed at the top surface of the mesa to provide a localized dot on the thermally sensitive material above it. A group of selectively energized heater elements forms a group of dots on the thermally sensitive material defining a character or information representation displayed on the thermally sensitive material.

The mesas comprising the heater element array are air-isolated from each other and joined by a metallic connecting pattern underneath the mesas between the semiconductor wafer 2 and the support 1 which pattern interconnects the heater elements in the mesas in the desired circuit configuration and extends out into bonding pads located above the openings 9 and 10 in the support 1 so that external connection can be made to the bonding pads through the openings 9 and 10 at the underside of support 1. Whereas, the external connections are formed at the underside of support 1 and are removed from the thermally sensitive material located above the mesas. While the air-isolated mesas are electrically and mechanically joined by the metallized pattern supported in the epoxy adhesive resting between the semiconductor wafer 2 and the support 1.

Figure 6:
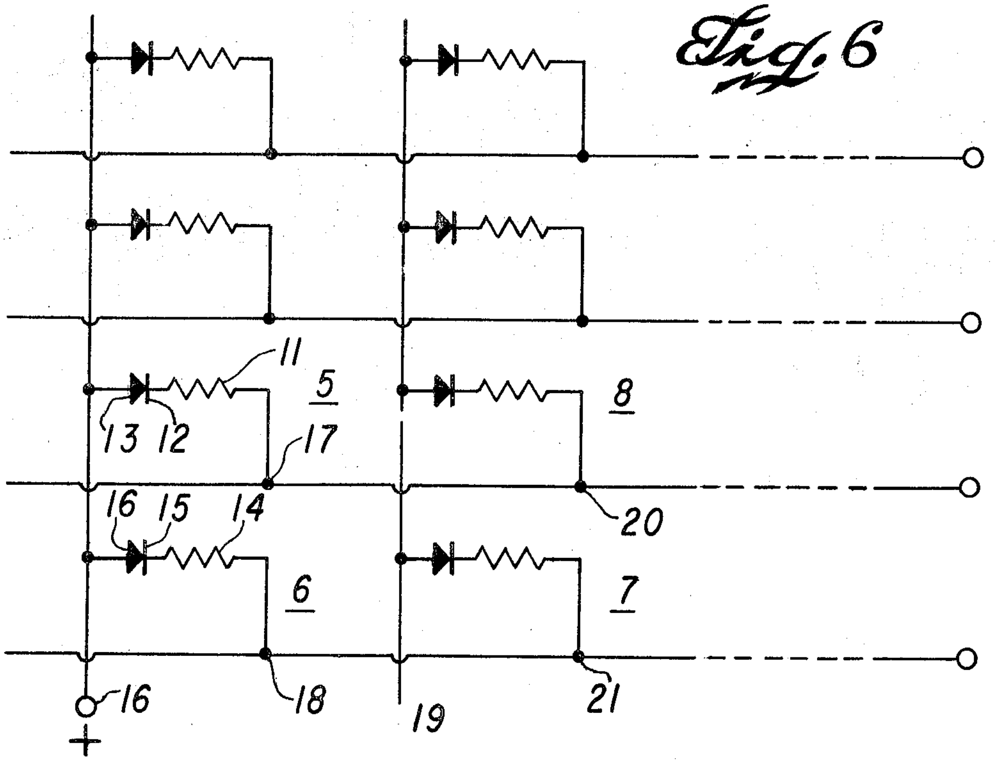
FIG. 6 is the circuit embodied in the heater array of FIG. 1.

Each mesa contains a diode - resistor pair which is interconnected to form a matrix having the capability of being selectively energized so that the power dissipated by the resistor causes the "hot spot" at the top surface of the selected mesa. Such a matrix is illustrated in FIG. 6 wherein the diode resistor pairs located in mesas 5–7 are specifically illustrated and the diode resistor pairs representing a 2 by 4 heater element array is shown. Whereas, resistor 14 and diode 15, 16 are located within the mesa 6 and resistor 11 and diode 12, 13 are located within the mesa 5. Thus, each diode resistor pair can be individually energized and groups of the diode resistor pairs can be selectively energized to cause any desired combination of "hot spots" at the surfaces of the mesas to provide the desired information display on the thermally sensitive material.

The construction of the heater element array of FIG. 1 may be better understood from the process of fabricating it.

Figure 3:
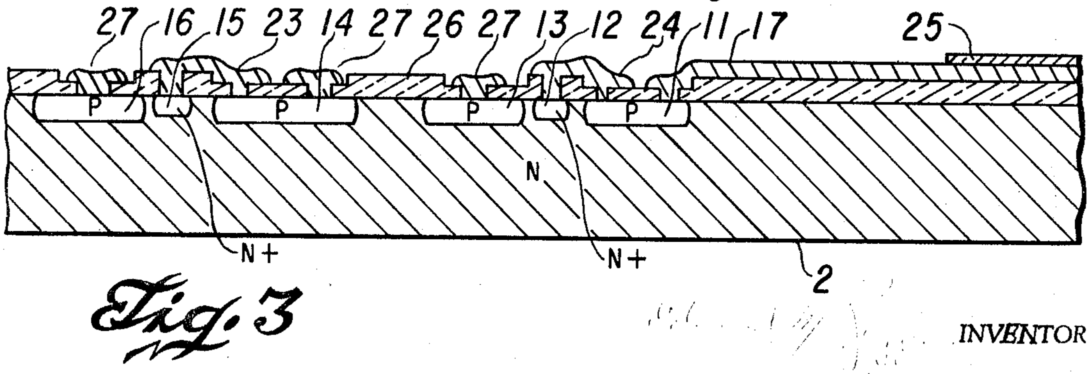
FIG. 3 is an intermediate structure in the fabrication of the heating element array of FIG. 1.

Referring to FIG. 3, there is illustrated a monocrystalline semiconductor wafer 2 of N-type silicon. The diode resistor pairs for the heating elements comprise diffused regions in the surface of the wafer 2. Whereas, one diode comprises the diffused P-type anode 13 forming a rectifying junction with the subjacent N-type semiconductor material. The heavily doped diffused region 12 provides a surface region for making ohmic connection to the cathode. Another diode comprises the diffused P-type anode 16 forming a rectifying junction with the subjacent N type material and the heavily doped N+ region 15 forming a surface region for making ohmic connection to the N-type cathode. The resistors are formed by P-type diffused regions 11 and 14 closely spaced to their respective diodes. The diodes and resistors are formed in the surface of wafer 2 utilizing the planar process in which an oxide film is thermally grown on the N-type silicon wafer of the desired resistivity by placing it in a furnace at an elevated temperature and passing an oxidizing agent over it. The resulting silicon dioxide film acts as a masking medium against the impurities which are later diffused into the wafer. Holes are produced in the oxide film to allow subsequent diffusion processes to form the resistor and diode functions. These holes which are patterns of the desired circuit elements are produced by photolithographic techniques. Contacts and interconnections to the circuit elements are made by similar photolithographic techniques using for example evaporated aluminum over the oxide to form a pattern connecting the diodes and resistors together and terminating in bonding pads for external connections. The connecting pattern comprises conductive strips 24, 27 and 17 on the oxide film 26 and certain ones of the conductive strips 17 for example extend out into an enlarged bonding pad as is more clearly illustrated in FIG. 2, 16–21, where 17 of FIG. 3 terminates in the enlarged bonding pad 17 of FIG. 2.

At this point in the process, the semiconductor wafer 2 is integral and contains the matrix or array of diode resistor pairs unisolated from one another in the semiconductor material but interconnected to one another by the metallic connecting pattern on the surface of the silicon oxide film 26 which metallic pattern terminates in a uniform row of bonding pads for external connection. These bonding pads are aligned with the openings 9, 10 in the support 1, i.e., they are located in such a manner with respect to the openings in the support that a bonding pad will be accessible through an opening in the support.

The semiconductor wafer 2 illustrated in FIG. 3 will subsequently be turned upside down and mounted on an opaque ceramic support illustrated in FIG. 1 as support 1 with an insulating adhesive and external connections made to the bonding pads from the underside of the support.

One of the problems encountered in the mounting of the semiconductor wafer 2 to the support 1 utilizing an insulating adhesive is that the adhesive may flow over the bonding pads and subsequently prevent good electrical connection to the bonding pads after the wafer 2 is mounted on the support 1.

Figure 4:
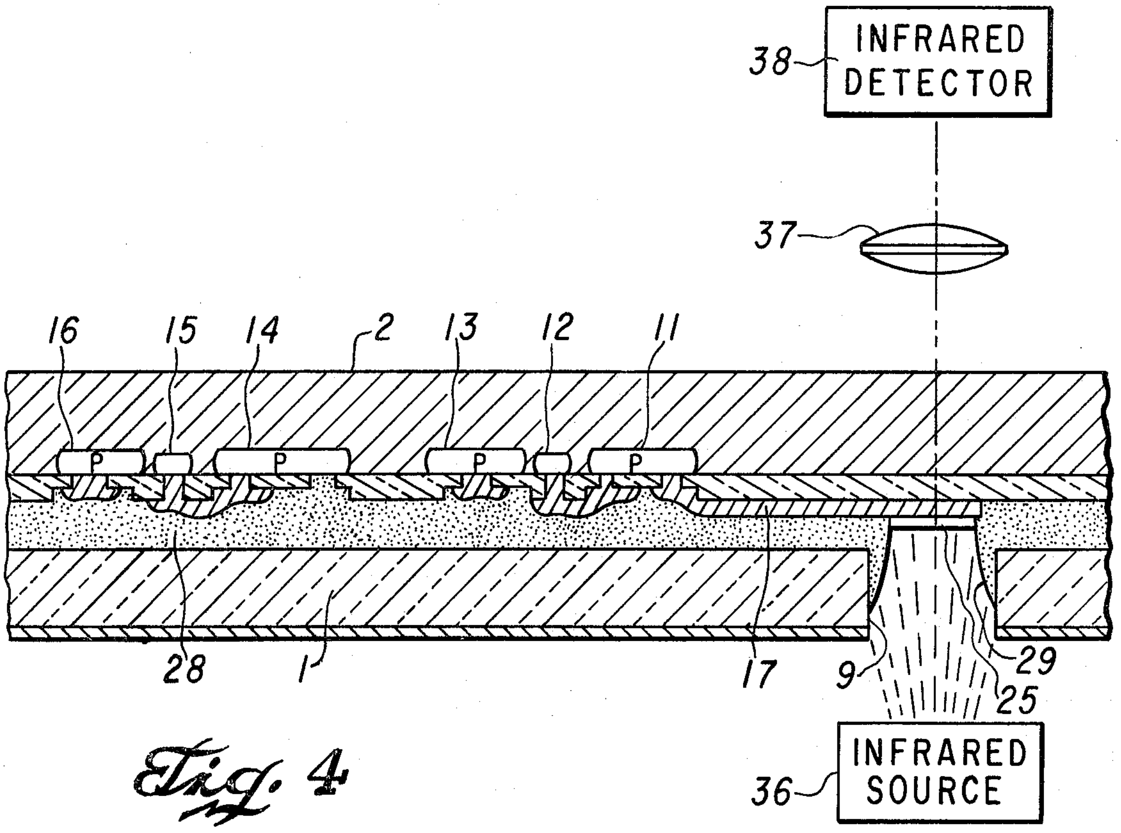
FIG. 4 is an intermediate structure in the fabrication of the heater element array of FIG. 1.

In order to overcome this difficulty, a parting agent is applied over the bonding pads in the FIG. 3 structure so that when the adhesive 28 in FIG. 4 is applied over the structure of FIG. 3 it does not adhere to the parting agent which can be subsequently easily removed to leave the bonding pads clean and free of the adhesive so that good electrical connection can be made to the bonding pads.

In order to selectively apply the parting agent over the bonding pads, a photoresist layer is applied over the entire surface of the semiconductor wafer 2 in FIG. 3, exposed in the desired pattern, developed and removed, all in a conventional manner, to leave photoresist material only over and adherent to the bonding pads as illustrated by photoresist material 25 over the enlarged bonding pad 17 in FIG. 3.

The epoxy adhesive is then applied over the semiconductor wafer 2 in FIG. 3. The epoxy adhesive adheres to the silicon oxide film 26 and the metallic connecting pattern except for the photoresist material 25.

The semiconductor wafer 2 including the metallic connecting pattern, the silicon oxide film 26, the photoresist material 25 over the bonding pads 17 and the epoxy adhesive are then turned upside down and mounted on the ceramic support 1 as illustrated in FIG. 4 with the photoresist material 25 overlying the opening 9 in the support 1. The epoxy adhesive 28 is then cured into a rigid solid and during the initial curing process, the viscocity of the epoxy adhesive decreases considerably prior to polymerization and hardening. This lower viscocity of the adhesive facilitates flowing of the epoxy adhesive which will not readily "wet" the photoresist material 25 thereby causing the epoxy adhesive to pull away from the photoresist material 25 and collect in the areas around the photoresist material 25 forming a meniscus with the wall of the opening 9 in the support 1 as is illustrated by 29.

After complete curing of the epoxy adhesive 28, the photoresist material 25 is removed by conventional techniques leaving the bonding pads free from the epoxy adhesive and clean for making good electrical connections thereto.

Referring to FIG. 2, there is illustrated the underside of the mesas 5–8 of FIG. 1 to show the metallic connecting pattern interconnecting the diode resistor pairs and extending out between the mesas and terminating in the bonding pads 16–21. As previously mentioned, each mesa for example 5 contains a diode 12, 13 and resistor 11 pair, one end of the resistor 11 being connected to the heavily doped N+ region 12 of the diode, the other end of the resistor 11 being connected to a metal strip which terminates in an enlarged bonding pad 17. The anodes 16 and 13 of the diodes are connected together by a conductive strip terminating in an enlarged bonding pad 16. One end of the resistor 14 is connected to the heavily doped N+ region 15 by conductive strip 23 and the other end of resistor 14 is connected to a metallic strip terminating in the enlarged bonding pad 18. The diode resistor pairs in mesas 7 and 8 as well as those in the other mesas are formed and interconnected in the same manner as the diode resistor pairs in mesas 5 and 6. The diode resistor pairs in mesas 7 and 8 have conductive strips connected thereto which terminate in enlarged bonding pads 19–21. The bonding pads 16–21 are arranged in a uniform row above the opening 9 in support 1. At the same time as the fabrication of the metallic connecting pattern resulting in the bonding pads 16–21 is formed, a metallic marker 22 is provided on the structure which marker subsequently is used for alignment purposes which will be described later.

Returning now to FIG. 4, the top surface of the semiconductor wafer 2 is removed to make the semiconductor wafer 2 as thin as desirable for example to a thinness of about 0.002 inches. This may be accomplished in one step or in multiple steps using lapping, sand blasting, or chemical etching. However, the integrity of the PN junctions is maintained. Since the thermally sensitive material will be positioned on or pass over the monocrystalline surface of the semiconductor wafer 2, it is chemically or mechanically polished.

The semiconductor material of wafer 2 around each diode-resistor pair is now removed leaving mesas air-isolated from one another.

In order to remove the semiconductor material from the wafer 2 and leave the air-isolated mesas, a photoresist layer is applied over the top surface of the wafer 2 and a photomask is applied over this photoresist layer to provide the desired exposure pattern for the photoresist layer. The photomask must be accurately aligned so that it defines only those portions of the semiconductor material which are desired to be removed and when the alignment accuracy is enhanced a higher density of diode resistor pairs can be achieved since one of the factors influencing the space left between the diode resistor pairs is the accuracy with which one can align the photomask so that only those portions of the semiconductor material desired to be removed are in fact removed. Enhanced accuracy of aligning the photomask is achieved by means of the openings 9 and 10 in the opaque ceramic support 1, the opaque marker 22 and infrared alignment techniques which will now be described.

Referring to FIG. 4, an opaque alignment marker 22 is located above the opening 9 as was previously described in connection with FIG. 2. The alignment marker 22 illustrated in FIG. 2 is made of a smaller size than the bonding pads 16–21 in order to distinguish the marker 22 from the bonding pads although this is not critical since the bonding pads comprise the same opaque material and can be utilized as markers. Located in the photomask is one or more opaque markers corresponding in number and pattern to the one or more markers 22. An infrared source 36 is located below the opening 9 in the FIG. 4 embodiment and a lens system 37 and infrared detector 38 are located above the opening 9 and above the semiconductor wafer 2. The infrared source shines infrared light through the opening 9 and through the semiconductor wafer 2 and oxide film which are transparent to infrared light, the marker 22 and the corresponding marker in the photomask being opaque to infrared light. The lens system 37 focuses the resulting infrared light pattern on the infrared detector 38 which converts the resulting pattern of infrared light to visible light which then can be examined by the human eye. On examining the visible light pattern corresponding to the alignment between the marker 22 and the corresponding marker on the photomask, the photomask is positioned to effect the desired alignment between marker 22 and the corresponding marker in the photomask thereby insuring that the photomask is accurately positioned to achieve and define the desired exposure pattern on the photoesist layer and in turn effect the accurate removal of semiconductor material only in those areas between diode-resistor pairs. The photoresist layer is then exposed through the photomask, developed and selectively removed to leave exposed those areas of the semiconductor surface which are to be removed. With the photoresist layer defining the desired pattern, the semiconductor material is etched down to the silicon oxide film to leave the air-isolated mesa shapes as illustrated in FIG. 5.

FIG. 1 illustrates the resulting shape of the semiconductor wafer wherein the semiconductor wafer 2 is integral except in the windows outlined 3 and 4 wherein are located the air-isolated mesa arrays.

Figure 5:
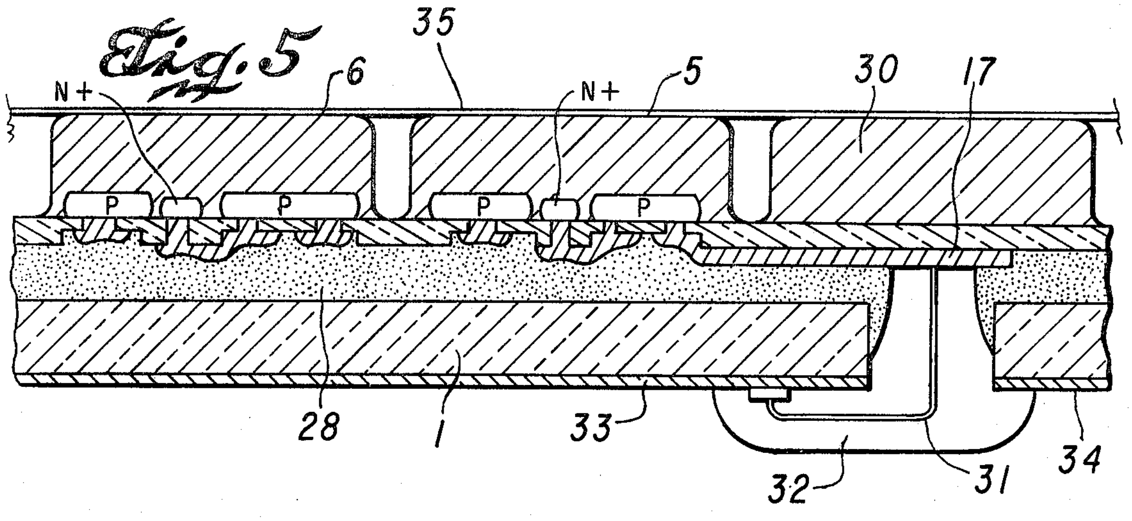
FIG. 5 is a cross section taken along the lines B—B of FIG. 1.

Referring to FIG. 5, after the mesa 5, 6, 30 are etched, one end of the wire 31 is thermal compression bonded to the bonding pad 17 and the other end is thermal compression bonded to a metallized strip 33 on the under side of the ceramic support 1 and thereafter the opening 9 in the support 1 is filled with epoxy to result in a solid rigid structure with no dangling wires.

The heater elements are thus located within the mesas face down and are selectively interconnected by a metallic connecting pattern supported in the epoxy adhesive 28 to form a first level interconnection pattern terminating in bonding pads 17 etc., located above openings in the support 1 while a second level interconnection pattern is achieved by a metallized pattern 33, 34 on the underside of the support 1 thereby permitting a large and complex array of circuit elements interconnected at different levels. The array has a high degree of electrical and thermal isolation between the circuit elements and comprises a rigid structre.

The thermally sensitive material 35 as is illustrated in FIG. 5 is placed in direct contact with the monocrystalline silicon mesas which are very thin thereby allowing a high degree of thermal communication between the mesas and the thermally sensitive material.

The 4 by 3 array of mesas is given herein as an example since any number and shape of the array may be chosen depending upon the character of the information desired to be displayed on the thermally sensitive material.

The number and kind of circuit elements located in each mesa and their conductivity type zones as well as that of the semiconductor wafer are given by way of example only since various types of circuit elements such as transistors may be provided in the mesas to provide heating elements and may be formed by epitaxial techniques for example in lieu of the described diffusion techniques while the semiconductor material may be other than silicon, for example germanium.

Furthermore, the methods described herein are useful for fabricating integrated semiconductor circuits having a high degree of thermal and electrical isolation between the circuit elements.

Moreover, the support 1 may be conductive and an insulating layer provided between the metallized pattern 33, 34 and the support 1, the metallic connecting pattern being insulated from the support by the adhesive 28.

It is to be understood that the above described embodiments are merely illustrative of the invention. Numerous other arrangement may be devised by those skilled in the art without departing from the spirit and scope of the invention as defined by the appended claims.

What is claimed is:

1. A method of making an integrated semiconductor circuit comprising the steps of: forming a plurality of circuit elements adjacent one surface of a semiconductor wafer with an insulating layer on said one surface having openings therein exposing contact areas on said circuit elements, forming a conductive pattern on said insulating layer extending into said openings and interconnecting selected ones of said circuit elements and having a selected portion thereof lying on said insulating layer away from said circuit elements, said selected portion providing a bonding pad on said conductive pattern, selectively applying a parting agent substantially to said bonding pad only, mounting said semiconductor wafer on a solid support having an opening therein with an insulating adhesive so that said one surface of said semiconductor wafer is adjacent said support and said parting agent and said bonding pad is aligned with said opening, removing said parting agent to leave said bonding pad of said conductive pattern exposed and attaching an electrical connection to said bonding pad of said conductive pattern through said opening.

2. A method according to claim 1, wherein said support is insulating and comprises a conductor attached to its opposite surface near said opening including the step of attaching said electrical connection to said conductor.

3. A method according to claim 1, including the step of removing semiconductor material from said semiconductor wafer from one surface of said semiconductor wafer opposite said one surface to physically separate said circuit elements.

4. A method according to claim 3, including the steps of: forming a first opaque marker on said insulating layer near said portion of said conductive pattern, aligning said marker with said opening in said support semiconductor the mounting of said semiconductor wafer on said support, and wherein said step of removing semiconductor material from said semiconductor wafer comprises applying a photoresist layer on said opposite surface of said semiconductor wafer, applying a photomask above said photoresist layer to define the desired exposure pattern on said photoresist layer, said photomask having a second opaque marker thereon corresponding to said first opaque marker, shining infrared light through said opening in said support, detecting the infrared light pattern passing through the semiconductor wafer to determine the alignment between said first and second markers, adjusting the position of said photomask until said first and second markers align with each other, exposing said photoresist layer through said photomask to define the desired pattern on said photoresist layer, and removing selected portions of said photoresist layer to expose portions of said semiconductor material desired to be removed.

5. A method of fabricating an integrated semiconductor circuit comprising the steps of: forming a plurality of circuit elements adjacent one surface of a semiconductor wafer with an insulating layer over said one surface having openings therein exposing contact areas on said circuit elements, forming a conductive pattern on said insulating layer extending into said openings interconnecting selected ones of said circuit elements and said conductive pattern having at least one portion on said insulating layer away from said circuit elements, forming a first opaque marker on said insulating layer near said at least one portion, mounting said semiconductor wafer on an opaque support having a first opening therein with an insulating adhesive attaching said one surface to said support with said first marker and said at least one portion aligned with said first opening, applying a photoresist layer having a second opaque marker thereon over said photoresist layer, shining infrared light through said first opening in said support, detecting the infrared light pattern passing through said semiconductor wafer to determine the alignment of said first and second markers, adjusting the position of said photomask until said first and second markers are in alignment, exposing said photoresist layer through said photomask to define the desired pattern on said photoresist layer, selectively removing portions of said photoresist layer to leave semiconductor material between said circuit elements exposed, and removing the exposed semiconductor material to separate said circuit elements.

6. A method according to claim 1 wherein said support is ceramic.

7. A method according to claim 1 wherein said adhesive is substantially non-wetting to said parting agent to thereby allow direct access to said parting agent through said opening.

8. A method of making an integrated semiconductor circuit comprising the steps of:

a. forming a plurality of circuit elements adjacent one surface of a semiconductor wafer with an insulating layer on said one surface having openings therein exposing contact areas on said circuit elements;

b. forming a conductive pattern on said insulating layer extending into said openings and interconnecting selected ones of said circuit elements and having a portion thereof lying on said insulating layer away from said circuit elements;

c. forming a first opaque marker on said insulating layer near said portion of said conductive pattern;

d. mounting with an insulating adhesive said semiconductor wafer on a support having an opening therein such that said marker is aligned with said opening in said support so that said one surface is adjacent said support and said parting agent is aligned with said opening;

e. removing said parting agent to leave said portion of said conductive pattern exposed; and f. removing semiconductor material from said semiconductor wafer from one surface of said semiconductor wafer opposite said one surface to physically separate said circuit elements, said step of removing comprising applying a photoresist layer on said opposite surface of said semiconductor wafer, applying a photomask above said photoresist layer to define the desired exposure pattern on said photoresist layer, said photomask having a second opaque marker thereon corresponding to said first opaque marker, shining infrared light through said opening in said support, detecting the infrared light passing through the semiconductor wafer to determine the alignment between said first and second markers, adjusting the position of said photomask until said first and second markers align with each other, exposing said photoresist layer through said photomask to define the desired pattern on said photoresist layer, and removing selected portions of said photoresist layer to expose portions of said semiconductor material desired to be removed.

* * * * *

UNITED STATES PATENT OFFICE

CERTIFICATE OF CORRECTION

Patent No. 3,762,038 Dated October 2, 1973

Inventor(s) Edward M. Ruggiero

It is certified that error appears in the above-identified patent and that said Letters Patent are hereby corrected as shown below:

Column 1, line 41, "3,323,341" should read -- 3,323,241 --.

Column 7, line 7, "semiconductor" should read -- during --.

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*